United States Patent
Idriss et al.

(10) Patent No.: US 12,152,091 B1
(45) Date of Patent: *Nov. 26, 2024

(54) SOLUTION POLYMERIZATION METHOD FOR SMART OPTICAL MATERIAL

(71) Applicant: IMAM MOHAMMAD IBN SAUD ISLAMIC UNIVERSITY, Riyadh (SA)

(72) Inventors: Hajo Idriss Mohammed Idriss, Riyadh (SA); Khalid Hassan Ibnouf Ahmed, Riyadh (SA); Osamah Abdulrahman Aldaghri, Riyadh (SA); Abueliz Khalid Modwi Khalid, Riyadh (SA); Amin Osman Elzupir Alamalhuda, Riyadh (SA)

(73) Assignee: IMAM MOHAMMAD IBN SAUD ISLAMIC UNIVERSITY, Riyadh (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/798,890

(22) Filed: Aug. 9, 2024

Related U.S. Application Data

(63) Continuation of application No. 18/647,753, filed on Apr. 26, 2024, now Pat. No. 12,110,350.

(51) Int. Cl.
| | | |
|---|---|---|
| C08F 2/46 | (2006.01) | |
| C08F 2/06 | (2006.01) | |
| C08F 2/44 | (2006.01) | |
| C08F 2/50 | (2006.01) | |
| C08F 120/06 | (2006.01) | |
| C08G 61/04 | (2006.01) | |
| H01S 5/36 | (2006.01) | |

(52) U.S. Cl.
CPC .............. *C08F 120/06* (2013.01); *C08F 2/06* (2013.01); *C08F 2/44* (2013.01); *H01S 5/36* (2013.01)

(58) Field of Classification Search
CPC .. C08F 120/06; C08F 2/06; C08F 2/44; C08F 2/50; C08F 2/48; H01S 5/36

USPC ....... 520/1; 372/68, 39; 522/6, 71, 189, 184, 522/1

See application file for complete search history.

(56) References Cited

U.S. PATENT DOCUMENTS

| | | |
|---|---|---|
| 4,251,407 A | 2/1981 | Schroeder et al. |
| 2018/0321510 A1 | 11/2018 | Vetro |
| 2019/0169438 A1 | 6/2019 | Fromentin et al. |
| 2019/0284324 A1 | 9/2019 | Rideiro et al. |

OTHER PUBLICATIONS

Quintero npl, Near-Field communication powered hydrogel-based smart contact lens, 2020, Adv. Mater. Technol., 5, Jul. 2, 2000 (Year: 2020).*

Lin, Z., et al., "Preparation and characterization of novel ZnS/sulfur-containing polymer nanocomposite optical materials with high refractive index and high nanophase contents", ScienceDirect, Polymer, vol. 51, No. 23, 2010, pp. 5424-5431.

Banerjee, A., et al., "Effect of Zinc Oxide Nanofiller on the Dielectric Thermal and Optical Properties of Polypropylene", IEEE Transactions on Industry Applications, vol. 59, No. 1, 2023, 2 total pages (abstract only).

* cited by examiner

*Primary Examiner* — Jessica Whiteley
(74) *Attorney, Agent, or Firm* — Oblon, McClelland, Maier & Neustadt, L.L.P.

(57) ABSTRACT

A method of making a smart optical material (SOM) including mixing polypropylene in a solvent to form a first solution. The method further includes mixing a zinc salt in 2-hydroxyethyl methacrylate and heating it to form a second solution. The method further includes mixing rhodamine B and a peroxide into the second solution to form a third solution. The method further includes mixing the third solution into the first solution to form a reaction solution, wherein the peroxide initiates polymerization of the 2-hydroxyethyl methacrylate to form poly (2-hydroxyethyl methacrylate). The method further includes separating the SOM from the reaction solution. The SOM has at least two bandgaps, a first bandgap is from 1.4-1.5 eV, and a second bandgap is from 1.8-1.9 eV.

16 Claims, 10 Drawing Sheets

SOLUTION POLYMERIZATION METHOD FOR SMART OPTICAL MATERIAL

STATEMENT OF ACKNOWLEDGEMENT

Support provided by the Imam Mohammad Ibn Saud Islamic University (IMSIU) is gratefully acknowledged.

CROSS-REFERENCE TO RELATED APPLICATIONS

The present application is a Continuation of U.S. application Ser. No. 18/647,753, now allowed, having a filing date of Apr. 26, 2024.

BACKGROUND

Technical Field

The present disclosure is directed to smart optical materials (SOMs) and, more particularly, directed to a method of making the SOM utilizing hybrid materials, for laser and optoelectronic applications.

Description of Related Art

The "background" description provided herein is to present the context of the disclosure generally. Work of the presently named inventors, to the extent it is described in this background section, as well as aspects of the description that may not otherwise qualify as prior art at the time of filing, are neither expressly nor impliedly admitted as prior art against the present invention.

Plastic has emerged as an indispensable component of modern life over the past half-century, leading to an increase in plastic manufacturing on a global scale. Plastic is extensively employed in various applications in today's society due to its lightweight nature and exceptional mechanical characteristics. However, only 9-12% of plastics are recycled or burned, while the remaining about 4.9 billion tons are disposed of in landfills or the marine environment annually. Plastic trash takes a long time to decompose naturally, leading to a rise in pollution. Moreover, burning the gathered plastics produces significant carbon dioxide emissions that could exacerbate global warming and climate change. Due to the non-biodegradable nature of plastics, a substantial amount of plastic garbage is produced daily, making waste disposal an urgent global issue.

Traditional solutions to plastic pollution include restricting plastic usage, promoting biodegradable plastics, and advancing biodegradation techniques. Conventional recycling methods, such as mechanical recycling of plastics, involve processes like grinding, melting, and remolding, which can recycle plastics but often at the expense of the material's physical properties. An environmentally sustainable approach is important to address these concerns. Numerous plastic recycling technologies exist, although nearly all have specific limitations. The chemical re-use of plastic has demonstrated superior efficiency compared to alternative recycling techniques. Chemical recycling occurs by breaking down plastics into their monomeric forms, potentially allowing for the creation of new polymers.

Polypropylene (PP) is the second most prevalent petroleum-derived plastic substance, following polyethylene (PE). PP is a transparent material with excellent mechanical properties. The substance is a petrochemical product derived from the propylene olefin monomer. Heat, high-energy radiation, and catalysts cause monomers to join, leading to propylene molecule polymerization and long polymer chains. However, a significant hurdle in the chemical processing of PP, or even PE, is the necessity of transforming the physical structure from polymer to aliphatic carbon. PE and PP are plastic polymers with a C—C backbone structure, which makes them resistant to biodegradation. PP has higher stress-breaking resilience than polyethylene, making it less biodegradable without pretreatment treatments such as prolonged exposure to high temperatures or UV light. Alkane dehydrogenase can break these single-bond chains. Nevertheless, its capabilities are restricted by its surface range activities, biofilm development, and similar factors.

There exists a need for a solution that not only effectively recycles waste polypropylene but also adds value through the creation of functional materials. The present disclosure aims to meet these needs by introducing a method for the fabrication of smart optical material (SOM) from polypropylene, which could be utilized for applications in laser and optoelectronic industries.

Accordingly, an object of the present disclosure is to develop an environmentally sustainable process that transforms plastic waste into valuable products like SOM, addressing both waste management and material reusability requirements.

SUMMARY

In an exemplary embodiment, a method of making a smart optical material (SOM) is described. The method includes mixing polypropylene in a solvent to form a first solution. The method further includes mixing a zinc salt in 2-hydroxyethyl methacrylate and heating to form a second solution. The method further includes mixing rhodamine B and a peroxide into the second solution to form a third solution. The method further includes mixing the third solution into the first solution to form a reaction solution, wherein the peroxide initiates polymerization of the 2-hydroxyethyl methacrylate to form poly (2-hydroxyethyl methacrylate). The method further includes separating the SOM from the reaction solution. Herein, the SOM has at least two bandgaps. A first bandgap is from 1.4-1.5 eV, and a second bandgap is from 1.8-1.9 eV.

In some embodiments, the SOM comprises 1-10 wt. % of the polypropylene, based on a total weight of the SOM.

In some embodiments, the SOM comprises 0.1-5 wt. % of the rhodamine B, based on a total weight of the SOM.

In some embodiments, the SOM comprises 80-98.9 wt. % of the poly (2-hydroxyethyl methacrylate), based on a total weight of the SOM.

In some embodiments, the rhodamine B is covalently bonded to the poly (2-hydroxyethyl methacrylate).

In some embodiments, the polypropylene is a waste polypropylene.

In some embodiments, the solvent is tetrahydrofuran, the zinc salt is zinc acetate, and the peroxide is benzoyl peroxide.

In some embodiments, the SOM is in a form of particles having an irregular shape and an average size of 0.5-5 μm.

In some embodiments, the particles are not aggregated. The rhodamine B and the polypropylene are homogeneously dispersed in a matrix of the poly (2-hydroxyethyl methacrylate) in the SOM.

In some embodiments, the SOM comprises 60-70 wt. % C, 30-40 wt. % 0, 0.1-1 wt. % Cl, and 0.01-0.5 wt. % Zn, based on a total weight of the SOM.

In some embodiments, the SOM has an absorption spectrum and a fluorescence spectrum that differs from an absorption spectrum and a fluorescence spectrum of a solution of rhodamine B alone.

In some embodiments, the SOM has an absorption spectrum with peaks between 310-320 nm and 490-620 nm.

In some embodiments, the SOM has a fluorescence spectrum with a single peak between 640-700 nm.

In some embodiments, upon irradiating the SOM with a 355 nm laser, the SOM produces laser peaks at 650 and 685 nm.

In some embodiments, the SOM has a melting point of 300-350° C.

In some embodiments, the SOM has an impedance of $1\times10^5$ to $9\times10^5$ Ω.cm.

In some embodiments, the SOM is a semiconductor material.

In another exemplary embodiment, a SOM made by the aforementioned method is described.

In yet another exemplary embodiment, a laser system, including the aforementioned made SOM is described.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof may be readily obtained as the same becomes better understood by reference to the following detailed description when considered in connection with the accompanying drawings, wherein.

DETAILED DESCRIPTION

Figure 1:
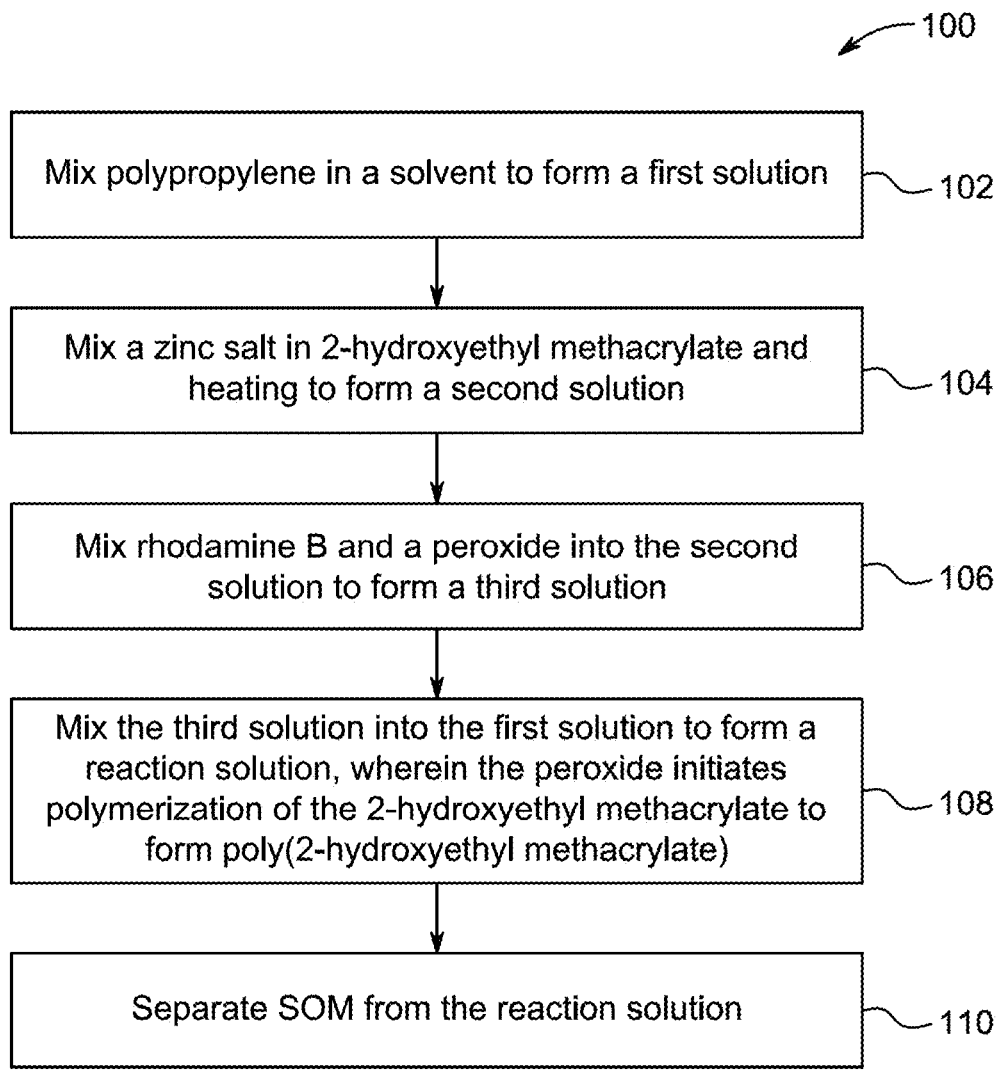
FIG. 1 is a flowchart illustrating a method of making a smart optical material (SOM), according to certain embodiments.

In the drawings, reference numerals designate identical or corresponding parts throughout the several views. Further, as used herein, the words "a," "an," and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), +/−15% of the stated value (or range of values), or +/−20% of the stated value (or range of values).

Within the description of this disclosure, where a numerical limit or range is stated, the endpoints are included unless stated otherwise. Also, all values and subranges within a numerical limit or range are specifically included as if explicitly written out.

The use of the terms "include," "includes", "including," "have," "has," or "having" should be generally understood as open-ended and non-limiting unless specifically stated otherwise. The present disclosure is intended to include all hydration states of a given compound or formula, unless otherwise noted or when heating a material.

As used herein, the term "solution" may be defined as a homogeneous mixture of two more substances.

As used herein, the term "solvent" may refer to a substance, preferably liquid, that dissolves other substances to form a solution.

As used herein, the term "weight percent" of a component, unless specifically stated to the contrary, is based on the total weight of the formulation or composition in which the component is included. For example, if a particular element or component in a composition or article is said to have 5 wt. %, it is understood that this percentage is in relation to a total compositional percentage of 100%.

As used herein, the term "alkyl" unless otherwise specified refers to both branched and straight chain aliphatic (non-aromatic) hydrocarbons which may be primary, secondary, and/or tertiary hydrocarbons typically having 1 to 32 carbon atoms (e.g., $C_1$, $C_2$, $C_3$, $C_4$, $C_5$, $C_6$, $C_7$, $C_8$, $C_9$, $C_{10}$, $C_{11}$, $C_{12}$, $C_{13}$, $C_{14}$, etc.) and specifically includes, but is not limited to, saturated alkyl groups such as methyl, ethyl, propyl, isopropyl, butyl, isobutyl, t-butyl, pentyl, isopentyl, neopentyl, hexyl, isohexyl, 3-methylpentyl, 2,2-dimethylbutyl, 2,3-dimethylbutyl, 2-ethylhexyl, heptyl, octyl, nonyl, 3,7-dimethyloctyl, decyl, undecyl, dodecyl, tridecyl, tetradecyl, pentadecyl, hexadecyl, heptadecyl, octadecyl, nonadecyl, eicosyl, guerbet-type alkyl groups (e.g., 2-methylpentyl, 2-ethylhexyl, 2-propylheptyl, 2-butyloctyl, 2-pentylnonyl, 2-hexyldecyl, 2-heptylundecyl, 2-octylodecyl, 2-nonyltridecyl, 2-decyltetradecyl, and 2-undecylpentadecyl), as well as unsaturated alkenyl and alkynyl variants such as vinyl, allyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, 5-hexenyl, oleyl, linoleyl, and the like.

The term "cycloalkyl" refers to cyclized alkyl groups. Exemplary cycloalkyl groups include, but are not limited to, saturated cycloalkyl groups such as cyclopropyl, cyclobutyl, cyclopentyl, cyclohexyl, norbornyl, and adamantyl, branched cycloalkyl groups such as 1-methylcyclopropyl and 2-methylcyclopropyl, and cycloalkenyl groups such as cyclobutenyl, cyclopentenyl, and cyclohexenyl.

The term "aryl" means a carbocyclic aromatic monocyclic group containing 6 carbon atoms which may be further fused to a second 5- or 6-membered carbocyclic group which may be aromatic, saturated or unsaturated. Aryl includes, but is not limited to, phenyl, anthracenyl, indanyl, 1-naphthyl, 2-naphthyl, and tetrahydronaphthyl. The fused aryls may be connected to another group either at a suitable position on the cycloalkyl/cycloalkenyl ring or the aromatic ring.

The term "arylalkyl", as used herein, refers to a straight or branched chain alkyl moiety (as defined above) that is substituted by an aryl group (as defined above), examples of which include, but are not limited to, benzyl, phenethyl, 2-methylbenzyl, 3-methylbenzyl, 4-methylbenzyl, 2,4-dimethylbenzyl, 2-(4-ethylphenyl) ethyl, 3-(3-propylphenyl) propyl, and the like.

The term "alkoxy" refers to an —O-alkyl group. Example alkoxy groups include, but are not limited to, methoxy, ethoxy, propoxy (e.g., n-propoxy and isopropoxy), and t-butoxy.

The term "halo" or "halogen" includes fluoro, chloro, bromo and iodo.

As used herein, the term "substituted" refers to at least one hydrogen atom that is replaced with a non-hydrogen group, provided that normal valencies are maintained and that the substitution results in a stable compound. When a substituent is noted as "optionally substituted", the substituent(s) are selected from alkyl, halo (e.g., chloro, bromo, iodo, fluoro), hydroxyl, alkoxy, oxo, alkanoyl, aryloxy, alkanoyloxy, amino (—$NH_2$), alkylamino (-NHalkyl), cycloalkylamino (-NHcycloalkyl), arylamino (-NHaryl), arylalkylamino (-NHarylalkyl), disubstituted amino (e.g., in which the two amino substituents are selected from alkyl, aryl or arylalkyl, including substituted variants thereof, with specific mention being made to dimethylamino), alkanoylamino, aroylamino, arylalkanoylamino, thiol, alkylthio, arylthio, arylalkylthio, alkylthiono, arylthiono, arylalkylthiono, alkylsulfonyl, arylsulfonyl, arylalkylsulfonyl, sulfonamide (e.g., —$SO_2NH_2$), substituted sulfonamide (e.g., -$SO_2$NHalkyl, -$SO_2$NHaryl, -$SO_2$NHarylalkyl, or cases where there are two substituents on one nitrogen selected from alkyl, aryl, or alkylalkyl), nitro, cyano, carboxy, unsubstituted amide (i.e. $CONH_2$), substituted amide (e.g., -CONHalkyl, -CONHaryl, -CONHarylalkyl or cases where there are two substituents on one nitrogen selected from alkyl, aryl, or alkylalkyl), alkoxycarbonyl, aryl, guanidine, heterocyclyl (e.g., pyridyl, furyl, morpholinyl, pyrrolidinyl, piperazinyl, indolyl, imidazolyl, thienyl, thiazolyl, pyrrolidyl, pyrimidyl, piperidinyl, homopiperazinyl), and mixtures thereof. The substituents may themselves be optionally substituted, and may be either unprotected, or protected as necessary, as known to those skilled in the art, for example, as taught in Greene, et al., "Protective Groups in Organic Synthesis", John Wiley and Sons, Second Edition, 1991, hereby incorporated by reference in its entirety.

As used herein, the term smart materials describes designed materials that have one or more properties that can be significantly changed in a controlled fashion by external stimuli, such as stress, moisture, electric or magnetic fields, light, temperature, pH, or chemical compounds. Specifically, the smart material is a smart optical material (SOM) which is changed with light.

Aspects of the present disclosure are directed towards a method for producing smart optical materials (SOMs) from hybrid materials. The method involves synthesizing a composite material including polypropylene including, e.g., recycled pre-consumer and post-consumer polypropylene waste. The resulting material exhibits dual optical bandgaps and improved impedance characteristics. The method of the present disclosure converts polypropylene into high-performance smart optical materials suitable for laser and optoelectronic applications while promoting waste reduction, thereby circumventing the drawbacks of the art.

Referring to FIG. 1, illustrated is a flow chart of a method 100 of making a smart optical material (SOM). The order in which the method 100 is described is not intended to be construed as a limitation, and any number of the described method steps can be combined in any order to implement the method 100. Additionally, individual steps may be removed or skipped from the method 100 without departing from the spirit and scope of the present disclosure.

At step 102, the method 100 includes mixing polypropylene (PP) in a solvent to form a first solution. In some embodiments, the solvent is tetrahydrofuran (THF). Tetrahydrofuran, employed as the solvent in this step, is particularly effective in dissolving polypropylene due to its strong solvating properties. The process may involve heating and continuous stirring until a homogenous solution is obtained. Such dissolution of polypropylene in tetrahydrofuran ensures a homogeneous mixture for the uniformity of the subsequent polymerization process. Optionally, other solvents that can dissolve PP may be used as well—for example, xylene, tetralin, decalin, 1,2,4-trichlorobenzene, butylated hydroxytoluene, etc. One of ordinary skill in the art would recognize that the method could be modified by using polyethylene instead of or in addition to the polypropylene.

In some embodiments, the polypropylene is a waste polypropylene. Waste polypropylene, a byproduct or discarded material from various industrial and consumer applications, is chosen due to its availability and the environmental benefits derived from its diversion from landfills and reduction in pollution. The use of waste polypropylene highlights the utilization of recycled materials by method 100, aligning with environmental sustainability by repurposing plastic waste into valuable new products.

In some embodiments, the waste polypropylene is sourced from at least one of a material used in material handling, packaging, medical devices, clothing, car parts, housewares, or toys. In some embodiments, the polypropylene has a density of 0.95-1.0 g/$cm^3$, preferably 0.96 g/$cm^3$, 0.97 g/$cm^3$, 0.98 g/$cm^3$, or 0.99 g/$cm^3$. In an embodiment, the polypropylene has a molecular weight of 100,000-1,000,000 g/mol, preferably 200,000-900,000 g/mol, 300,000-800,000 g/mol, 400,000-700,000 g/mol, or about 500,000-600,000 g/mol.

In some embodiments, the materials containing the polypropylene are subject to at least one of mechanical grinding, cryogenic grinding, and waterjet powdering prior to the dissolving in the first solution. Mechanical grinding typically involves a machining process which uses a grinding wheel as cutting tool to form smaller pieces of a material. In another embodiment, the polyurethane is manually cut into smaller pieces. Cryogenic grinding typically includes cooling or chilling a material and then grinding it into a small particle size. Waterjet powdering is an industrial tool using an extremely high-pressure jet of water, or a mixture of water and an abrasive substance to cut a material. In a preferred embodiment, the materials are washed to remove contaminants.

In some embodiments, prior to the mixing the method further includes processing the polypropylene by at least one of two-roll milling, kneading, and homogenizing in a Banbury mixer. These processes form a uniform particle size and shape of the polypropylene. In a preferred embodiment, the polypropylene is in form of ground material, preferably with a particle size from 1 to 5 mm, preferably 2-4 mm, or about 3 mm.

At step 104, the method 100 includes mixing a zinc salt in monomer and heating to form a second solution. The process of fabricating the SOM involves concurrent preparation of the second solution, which includes mixing the zinc salt in the monomer. This step involves the mixing of the zinc salt with the monomer followed by heating to ensure complete dissolution and homogeneity of the solution. Suitable examples of zinc salt include zinc chloride, zinc nitrate, and zinc acetate. In a preferred embodiment, the zinc salt is zinc acetate (ZnAc). The choice of zinc acetate is due to its effective role as a catalyst in the polymerization process, which will follow in subsequent steps.

During the mixing process, continuous stirring may be employed to ensure that the zinc acetate is evenly distributed throughout the monomer. This stirring is maintained while the mixture is subjected to heating at a temperature of 50-150° C., preferably 60-140° C., 70-130° C., 80-120° C., 90-110° C., or about 100° C. The heating is conducted at a controlled temperature sufficient to promote the dissolution of the zinc acetate into the monomer. The controlled temperature helps maintain the stability of the monomer while ensuring that the zinc acetate is fully integrated into the solution. The mixture is stirred until a transparent solution is obtained, indicating that the zinc acetate has fully dissolved, and the mixture is homogeneous. In a preferred embodiment, there is no additional solvent in this step and the zinc salt is dissolved in the monomer directly.

The monomer is chosen based on the desired application of the material produced. In an embodiment, the monomer is an allyl monomer, i.e., a compound containing an allyl group, capable of undergoing polymerization selected from the group consisting of aromatic vinyl compounds such as styrene, [alpha]-methylstyrene, vinyltoluene, chlorostyrene, chloromethylstyrene and divinylbenzene; alkyl mono (meth) acrylates such as methyl (meth)acrylate, n-butyl (meth) acrylate, n-hexyl (meth)acrylate, cyclohexyl (meth)acrylate, 2-ethylhexyl (meth)acrylate, methoxydiethylene glycol (meth)acrylate, methoxypolyethylene glycol (meth)acrylate, 3-chloro-2-hydroxypropyl (meth)acrylate, stearyl (meth) acrylate, lauryl (meth)acrylate, phenyl (meth)acrylate, glycidyl (meth)acrylate and benzyl (meth)acrylate, 2-hydroxyethyl (meth)acrylate, 2-hydroxypropyl (meth)acrylate, 3-hydroxypropyl (meth)acrylate, 3-phenoxy-2-hydroxypropyl (meth)acrylate and 4-hydroxybutyl (meth)acrylate; di (meth) acrylates such as ethylene glycol di(meth)acrylate, diethylene glycol di(meth)acrylate, triethylene glycol di (meth)acrylate, polyethylene glycol di(meth)acrylate, 1,3-butylene glycol di(meth)acrylate, 1,6-hexanediol di (meth) acrylate, neopentyl glycol di(meth)acrylate, polypropylene glycol di (meth)acrylate, 2-hydroxy-1,3-di (meth)acryloxypropane, 2,2-bis [4-((meth)acryloxyethoxy) phenyl] propane, 2,2-bis [4-((meth)acryloxydiethoxy) phenyl] propane and 2,2-bis [4-((meth)-acryloxypolyethoxy) phenyl] propane; tri (meth) acrylates such as trimethylolpropane tri (meth)acrylate and tetramethylolmethane tri (meth)acrylate; tetra (meth) acrylates such as tetramethylolmethane tetra (meth)acrylate. These monomers may be used singly or in combination of two or more. In the above description, "(meth)acrylate" means "methacrylate" or "acrylate", and "(meth)acryloxy" means "methacryloxy" or "acryloxy".

In a preferred embodiment, the allyl monomer is a (meth) acrylate monomer having the following structure (I):

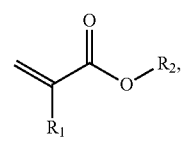

$R_1$ is a hydrogen, an optionally substituted alkyl group having 1-10 carbon atoms, preferably 2-9, 3-8, 4-7, or 5-6 carbon atoms, or an optionally substituted aryl group having 1-10 carbon atoms, preferably 2-9, 3-8, 4-7, or 5-6 carbon atoms. $R_2$ is a hydrogen, an optionally substituted alkyl group having 1-10 carbon atoms, preferably 2-9, 3-8, 4-7, or 5-6 carbon atoms, or an optionally substituted aryl group having 1-10 carbon atoms, preferably 2-9, 3-8, 4-7, or 5-6 carbon atoms. In a preferred embodiment, the monomer is 2-hydroxyethyl methacrylate (2-HEMA) having the following structure (II):

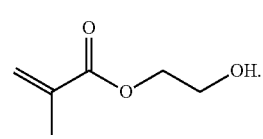

In a preferred embodiment, the monomer is polymerized in the SOM, preferably polymerization of the 2-hydroxyethyl methacrylate to form poly (2-hydroxyethyl methacrylate). In some embodiments, the poly (2-hydroxyethyl methacrylate) includes 2-10,000, preferably 100-9,000, 200-8,000, 300-7,000, 400-6,000, 500-5,000, 1,000-4,000, or 2,000-3,000 polymerized units of the 2-hydroxyethyl methacrylate.

The second solution may also comprise a second monomer different from the allyl monomer that is capable of polymerizing with the allyl monomer described above. The properties of the resulting polymer can be adjusted by the incorporation of a second monomer. Examples of a suitable second monomer include: aromatic vinyl compounds such as styrene, [alpha]-methylstyrene, vinyltoluene, chlorostyrene, chloromethylstyrene and divinylbenzene; alkyl mono (meth) acrylates such as methyl (meth)acrylate, n-butyl (meth)acrylate, n-hexyl (meth)acrylate, cyclohexyl (meth) acrylate, 2-ethylhexyl (meth)acrylate, methoxydiethylene glycol (meth)acrylate, methoxypolyethylene glycol (meth) acrylate, 3-chloro-2-hydroxypropyl (meth)acrylate, stearyl (meth)acrylate, lauryl (meth)acrylate, phenyl (meth)acrylate, glycidyl (meth)acrylate and benzyl (meth)acrylate, 2-hydroxyethyl (meth)acrylate, 2-hydroxypropyl (meth) acrylate, 3-hydroxypropyl (meth)acrylate, 3-phenoxy-2-hydroxypropyl (meth)acrylate and 4-hydroxybutyl (meth)acrylate; di (meth) acrylates such as ethylene glycol di(meth) acrylate, diethylene glycol di(meth)acrylate, triethylene glycol di(meth)acrylate, polyethylene glycol di (meth)acrylate, 1,3-butylene glycol di(meth)acrylate, 1,6-hexanediol di (meth)acrylate, neopentyl glycol di(meth)acrylate, polypropylene glycol di(meth)acrylate, 2-hydroxy-1,3-di (meth) acryloxypropane, 2,2-bis [4-((meth)acryloxyethoxy) phenyl] propane, 2,2-bis [4-((meth)acryloxydiethoxy) phenyl] propane and 2,2-bis [4-((meth)-acryloxypolyethoxy) phenyl] propane; tri (meth) acrylates such as trimethylolpropane tri (meth)acrylate and tetramethylolmethane tri (meth)acrylate; tetra (meth) acrylates such as tetramethylolmethane tetra (meth)acrylate.

At step 106, the method 100 includes mixing a fluorescent dye, also referred to as the dye, and a peroxide into the second solution to form a third solution. The third solution is formulated by introducing the dye and the peroxide into the previously prepared second solution, which contains the zinc salt and the monomer. The resultant third solution represents a mixture where the zinc salt, the monomer, the fluorescent dye, and the peroxide are all uniformly distributed.

The peroxide helps to initiate the polymerization process of the monomer within the solution. Examples of suitable organic peroxide include dialkyl peroxides, such as diisopropyl peroxide and di-t-butyl peroxide; ketone peroxides such as methyl ethyl ketone peroxide, methyl isopropyl ketone peroxide, acetylacetone peroxide, methyl isobutyl ketone peroxide and cyclohexane peroxide; peroxydicarbonates such as diisopropyl peroxydicarbonate, bis (4-t-butyl-cyclohexyl) peroxydicarbonate, di-sec-butyl peroxydicarbonate and isopropyl-sec-butylperoxydicarbonate; peroxyesters such as t-butyl peroxy-2-ethylhexanoate and t-hexyl peroxy-2-ethylhexanoate; diacyl peroxides such as benzoyl peroxide, acetyl peroxide and lauroyl peroxide; peroxyketals such as 2,2-di (tert-butylperoxy) butane, 1,1-di (tert-butylperoxy) cyclohexane and 1,1-bis (tert-butylperoxy) 3,3,5-tri methylcyclohexane; and mixtures thereof. In some embodiments, the peroxide is benzoyl peroxide (BP).

The dye is preferably rhodamine B (RhB). Rhodamine B, a fluorescent dye, is chosen for its ability to impart the desired fluorescence characteristics to the smart optical material. This compound helps to achieve the specific light absorption and emission properties required for laser and optoelectronic applications. As one of ordinary skill in the art would recognize, the rhodamine B could be replaced by or in addition to another dye, in order to adjust the optical properties of the material. The other dye is selected from the group consisting of dyes from the azo, rhodamine, cyanine, polymethine, merocyanine, fluorescein, pyrylium, porphyrin, phthalocyanine, perylene, coumarin, acridine, indolenine, indol-2-ylidene, benzanthrone, anthrapyrimidine, anthrapyridone, benzotriazole, benzophenone, anthraquinone, triazine and oxalanilide families.

At step 108, the method 100 includes mixing the third solution into the first solution to form a reaction solution. That is, the third solution, which includes the zinc salt, the monomer, the fluorescent dye, and the peroxide is added to the first solution containing polypropylene dissolved in a solvent. The peroxide acts as the initiator, as it decomposes to generate free radicals that start the polymerization chain reaction of the monomer. In a preferred embodiment, the first solution is added to the third solution within 5 minutes, preferably 4 mins, 3 mins, 2 mins, 1 min, or 30 seconds after the third solution is made to prevent the full polymerization of the monomer before the PP is added to make the SOM. In a preferred embodiment, the peroxide initiates polymerization of the 2-hydroxyethyl methacrylate to form poly (2-hydroxyethyl methacrylate).

In some embodiments, the terminal hydroxyl groups of the 2-hydroxyethyl methacrylate in the poly (2-hydroxyethyl methacrylate form a hydrogen bond with an oxygen atom in the rhodamine B. In other embodiments, the terminal hydroxyl groups of the 2-hydroxyethyl methacrylate in the poly (2-hydroxyethyl methacrylate react with a carboxylic acid group in the rhodamine B to form a covalent bond. In the reaction, the hydroxyl group on the poly (2-hydroxyethyl methacrylate in a presence of an acid catalyst undergoes esterification to produce an ester bond between the poly (2-hydroxyethyl methacrylate and the rhodamine B as would be understood by one of ordinary skill in the art. In a preferred embodiment, an acid catalyst such as sulfuric acid is added to the reaction solution for the esterification to occur. The covalent bonding ensures the homogeneous distribution of the rhodamine B in the SOM.

At step 110, the method 100 includes separating the SOM from the reaction solution. That is, the final stage in the method 100 for fabricating the SOM involves separating the newly formed SOM from the reaction solution. Herein, the reaction solution (as previously obtained) typically transitions from a liquid state to a solid form. This solidification indicates the formation of the SOM. The step involves isolating the poly (2-hydroxyethyl methacrylate) matrix embedded with functional components from the solvent and unreacted materials, providing the SOM. The SOM is in the form of solid red material, indicative of the presence of rhodamine B which imparts the red color. The separation may be achieved through various methods such as filtration, evaporation, decanting, or centrifugation. In some examples, the separated solid smart optical material may be subjected to further processing steps, which may include washing with appropriate solvents to remove any impurities and drying to eliminate any residual solvent.

In some embodiments, the SOM comprises 1-10 wt. % of the polypropylene, preferably 2-9 wt. %, 3-8 wt. %, 4-7 wt. %, or 5-6 wt. % based on the total weight of the SOM. This range is selected to provide the necessary mechanical strength and structural integrity to the SOM without compromising its optical characteristics.

In some embodiments, the SOM comprises 0.1-5 wt. % of the rhodamine B and/or other dye, preferably 0.5-4.5 wt. %, 1.0-4.0 wt. %, 1.5-3.5 wt. %, or 2.0-3.0 wt. % based on the total weight of the SOM. The rhodamine B, a fluorescent dye, is responsible for the characteristic absorption and emission spectra of the SOM, and the given proportion helps to achieve the desired fluorescence.

In some embodiments, the SOM comprises 80-98.9 wt. % preferably 82-98 wt. %, 84-96 wt. %, 86-94 wt. %, 88-92 wt. %, or about 90 wt. % of the polymerized monomer, preferably poly (2-hydroxyethyl methacrylate), based on the total weight of the SOM. This component forms the majority of the SOM, creating the matrix within which other components are embedded. In a preferred embodiment, the rhodamine B and the polypropylene are homogeneously dispersed in a matrix of the polymer to form the SOM.

In some embodiments, the SOM comprises 60-70 wt. % C, 30-40 wt. % 0, 0.1-1 wt. % $C_1$, and 0.01-0.5 wt. % Zn, based on the total weight of the SOM. That is, the SOM is composed of 60-70 weight percent (wt. %) carbon (C), preferably 61-69 wt. %, preferably 62-68 wt. %, preferably 63-65 wt. % of C; 30-40 wt. % oxygen (O), preferably 31-39 wt. %, preferably 32-38 wt. %, preferably 33-37 wt. %, preferably 34-36 wt. %, preferably 35-36 wt. %; 0.1-1 wt. % chlorine (Cl), preferably 0.2-0.9 wt. %, preferably 0.3-0.8 wt. %, preferably 0.3-0.5 wt. %, preferably 0.3-0.4 wt. %; and 0.01-0.5 wt. % zinc (Zn), preferably 0.02-0.4 wt. %, preferably 0.03-0.3 wt. %, 0.05-0.02 wt. %, preferably 0.07-0.01 wt. %, preferably 0.08-0.09 wt. %.

In some embodiments, the SOM is in the form of particles. In some embodiments, the SOM particles have an irregular shape. In some embodiments, the particles may exist in other morphological forms such as wires, spheres, rods, crystals, rectangles, triangles, pentagons, hexagons, prisms, disks, cubes, ribbons, blocks, beads, toroids, discs, barrels, nanogranules, whiskers, nanoflakes, foils, powders, boxes, stars, tetrapods, belts, urchins, flowers, etc. and mixtures thereof. In a preferred embodiment, the SOM takes the form of discrete particles characterized by an irregular shape, with the size of these particles being maintained within the range of 0.5 to 5 micrometers (μm) on average, preferably 1-4.5 μm, 1.5-4.0 μm, 2.0-3.5 μm, or 2.5-3.0 μm. In some embodiments, the particles are not aggregated and form a distributed network similar to that of a glass slide. Moreover, the absence of particle aggregation ensures uniformity in the optical behavior of the SOM, allowing for consistent performance across different parts of the optical element produced therefrom.

In the present embodiments, the SOM has at least two bandgaps. Herein, a first bandgap is from 1.4-1.5 eV, preferably 1.42-1.48 eV, or 1.44-1.46 eV and a second bandgap is from 1.8-1.9 eV, preferably 1.82-1.88 eV, or 1.84-1.86 eV. This multiplicity of bandgaps allows the SOM to absorb and interact with a broader range of the electromagnetic spectrum, enhancing its utility in various optical applications. The first bandgap of the SOM falls within the range of 1.4 to 1.5 electron-volts (eV), which is within the near-infrared to the visible spectrum, while the second bandgap ranges from 1.8 to 1.9 eV, aligning it closely with the visible spectrum. These bandgap ranges allow transitions of electrons that can interact with light within these energy ranges.

In some embodiments, the SOM has a melting point of 300-350° C., preferably 310-340° C., or 320-330° C. This melting point range is indicative of the thermal stability of the SOM, as may be required for applications that may expose the SOM to high-temperature environments. A higher melting point ensures that the SOM can maintain its structural integrity and optical properties without degradation when subjected to such conditions.

In some embodiments, the SOM has an impedance of $1\times10^5$ to $9\times10^5$ Ω.cm, preferably $2\times10^5$ Ω.cm, $3\times10^5$ Ω.cm, $4\times10^5$ Ω.cm, $5\times10^5$ Ω.cm, $6\times10^5$ Ω.cm, $7\times10^5$ Ω.cm, or $8\times10^5$ Ω.cm. An impedance within this range indicates that the SOM has a moderate level of resistance to electric current. In particular, this range of impedance values is indicative of suitability of the SOM for applications where controlled electrical conductivity is required. In some embodiments, the SOM is a semiconductor material. The semiconductor nature of the SOM allows for its use in laser and optoelectronic applications where it may be required to interact with or modulate light.

In some embodiments, the SOM has an absorption spectrum and a fluorescence spectrum that differs from the absorption spectrum and fluorescence spectrum of a solution of rhodamine B alone. That is, unlike a solution of rhodamine B alone, which has its characteristic absorption spectrum and fluorescence spectrum, the absorption spectrum and the fluorescence spectrum of the SOM have been altered through the incorporation of rhodamine B into the polymer matrix. This indicates that interactions are formed between the materials incorporated into the SOM. For example, chemical interactions such as covalent bonds as previously discussed or intermolecular forces such as ion-ion interactions, dipole-dipole interactions, hydrogen bonding, and London dispersion forces.

In some embodiments, the SOM has an absorption spectrum with peaks between 310-320 nm, preferably 312-318 nm, or 314-316 nm and 490-620 nm, preferably 500-610 nm, 510-600 nm, 520-590 nm, 530-580 nm, 540-570 nm, or 550-560 nm. This range captures part of the ultraviolet spectrum as well as a significant portion of the visible spectrum. The dual peaks indicate that the material can be used effectively in applications requiring sensitivity to multiple wavelengths within this range.

In some embodiments, the SOM has a fluorescence spectrum with a single peak between 640-700 nm, preferably 650-690 nm, 660-680 nm, or about 670 nm. That is, the SOM displays a single prominent peak between 640-700 nm, falling within the red to near-infrared region, which may be highly relevant for certain applications.

In some embodiments, upon irradiating the SOM with a 355 nm laser, the SOM produces laser peaks at 650 and 685 nm. This indicates its potential as a laser medium. These specified optical properties of the SOM, including its distinct bandgaps and its absorption spectrum and fluorescence spectrum, make it a versatile material suitable for a wide array of applications in the fields of optoelectronics and laser technology. Therefore, the present disclosure includes a method generating a laser light, comprising irradiating the SOM with a laser where the SOM converts the laser light to a different wavelength as described above.

The present disclosure further provides a laser system comprising the SOM. The laser system comprising the SOM utilizes the unique properties of the SOM as an integral part of its design. The SOM, being a semiconductor material with specific optical bandgaps, acts as an active laser medium within the laser system. In the laser system, the SOM defines the characteristics of the emitted laser light. Further, the semiconducting properties of the SOM allow for integration into electronic circuits to control operations of the laser system.

EXAMPLES

The following examples demonstrate a method of making a smart optical material (SOM). The examples are provided solely for illustration and are not to be construed as limitations of the present disclosure, as many variations thereof are possible without departing from the spirit and scope of the present disclosure.

Example 1: Materials

Polypropylene (PP) is sourced as waste polypropylene. Tetrahydrofuran (THF) is used as the solvent. Zinc acetate (ZnAc) is used as the zinc salt. Benzoyl peroxide (BP) is used as the peroxide.

Example 2: SOM Preparation

The initial step involved the dissolution of polypropylene (PP) in tetrahydrofuran (THF) to form the first solution. Specifically, 0.5 grams of waste polypropylene was thoroughly dissolved in 10 milliliters of tetrahydrofuran under continuous stirring. This process was enhanced by applying heat below 60° C. to the mixture, ensuring that the polypropylene was completely integrated into the THF to achieve a homogeneous solution.

Following the preparation of the first solution, zinc acetate (ZnAc) was incorporated into 2-hydroxyethyl methacrylate (2-HEMA). In this procedure, 0.025 grams of zinc acetate was added to 4 milliliters of 2-hydroxyethyl methacrylate and stirred continuously until the zinc acetate was fully dissolved. This mixture was then placed on a hotplate stirrer and heated to 100° C. to ensure complete integration of the components. The procedure was carried out using the hot plate stirrer to combine both the heating and the stirring functionalities, ensuring a controlled environment for chemical reactions. Once the zinc acetate and 2-hydroxyethyl methacrylate solution achieved a transparent state through continuous stirring at ambient temperature, the mixture was then transferred to a hotplate stirrer set at a temperature of 100° C.

Subsequently, the rhodamine B (RhB) and the benzoyl peroxide (BP) were mixed with the second solution containing the zinc acetate and the 2-hydroxyethyl methacrylate to form the third solution. Specifically, 0.03 grams of rhodamine B and 0.03 grams of benzoyl peroxide, each dissolved in 4 milliliters of tetrahydrofuran, were added sequentially to the second solution. That is, the process began by adding 0.03 grams of rhodamine B into the second solution, and then 0.03 grams of benzoyl peroxide was added to the mixture. Both rhodamine B and benzoyl peroxide were added sequentially to ensure proper dissolution and distribution within the solution, with each component being dissolved in 4 milliliters of tetrahydrofuran prior to addition. The addition process was managed to prevent premature initiation of the polymerization and to ensure the complete dissolution of both rhodamine B and benzoyl peroxide into the second solution of zinc acetate and 2-hydroxyethyl methacrylate.

The process then involved combining the first solution with the third solution containing zinc acetate, 2-hydroxyethyl methacrylate, rhodamine B, and benzoyl peroxide. The combined solution was then subjected to continuous stirring and heating at 100° C. for 10 minutes. This temperature was maintained for the benzoyl peroxide to effectively initiate the polymerization of 2-hydroxyethyl methacrylate into poly (2-hydroxyethyl methacrylate). The stirring may be performed for 10 minutes to allow for complete polymerization. Such stirring facilitates a uniform reaction throughout the mixture, ensuring that the heat is evenly distributed and that the reactive components interact effectively.

The above process facilitates the polymerization of 2-hydroxyethyl methacrylate into poly (2-hydroxyethyl methacrylate), effectively embedding the rhodamine B within the polymer matrix and forming a homogeneous red solution. Finally, the resultant homogeneous red solution is dried to extract a solid red optical material. The drying process solidifies the material, thereby obtaining the SOM for use in laser and optoelectronic applications.

Figure 2:
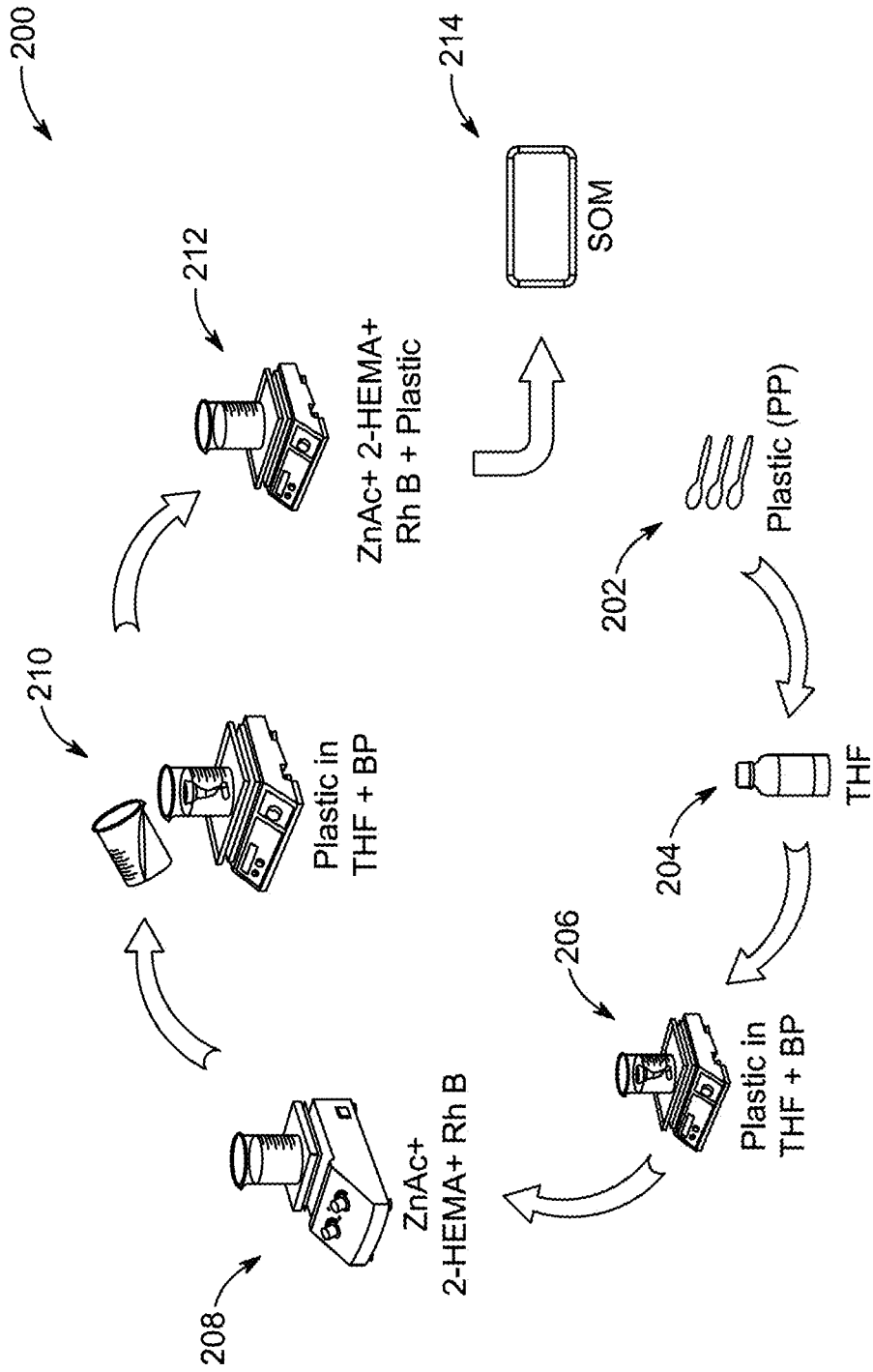
FIG. 2 is an illustration depicting process steps for making the SOM, according to certain embodiments.

Referring to FIG. 2, illustrated is a process flow (as represented by reference numeral 200) depicting stages involved in making the smart optical material (SOM). At stage 202, waste polypropylene (PP) is provided as the starting material for the process. At stage 204, tetrahydrofuran (THF) is obtained, which acts as a solvent for dissolving the polypropylene. At stage 206, the polypropylene is mixed with THF, and benzoyl peroxide (BP) is added to the solution. This mixture is then subjected to heating to dissolve the polypropylene, forming the first solution containing plastic in THF and BP. Subsequently, at stage 208, a separate second solution is prepared by mixing zinc acetate (ZnAc) and 2-hydroxyethyl methacrylate (2-HEMA) along with rhodamine B (RhB). This second solution is then placed on a hotplate stirrer, where it is heated to ensure the full dissolution of the components, particularly the zinc acetate. At stage 210, the third solution is formed by adding the heated mixture of ZnAc, 2-HEMA, and RhB to the first solution containing the dissolved plastic in THF and BP. At this juncture, the components are thoroughly mixed. At stage 212, the reaction solution that results from combining the first and second solutions is further stirred at a temperature of 100° C. for a duration of 10 minutes. This heating and stirring action initiate the polymerization of the 2-hydroxyethyl methacrylate by the benzoyl peroxide, which eventually leads to the formation of poly (2-hydroxyethyl methacrylate) and embeds the rhodamine B within the polymer matrix. Finally, at stage 214, the resultant SOM is separated from the reaction solution. The SOM, obtained as solid red material, embodies the desired properties for applications in laser and optoelectronic devices.

Example 3: SOM Characterization

The thermal properties of SOM were characterized by its melting point. For purposes of the present disclosure, the melting points of PP and SOM were determined using a melting point apparatus. PP has a melting point of 165° C., while the SOM had a higher melting point of 350° C. This high melting point is advantageous for applications involving high-temperature operations.

Figure 3:
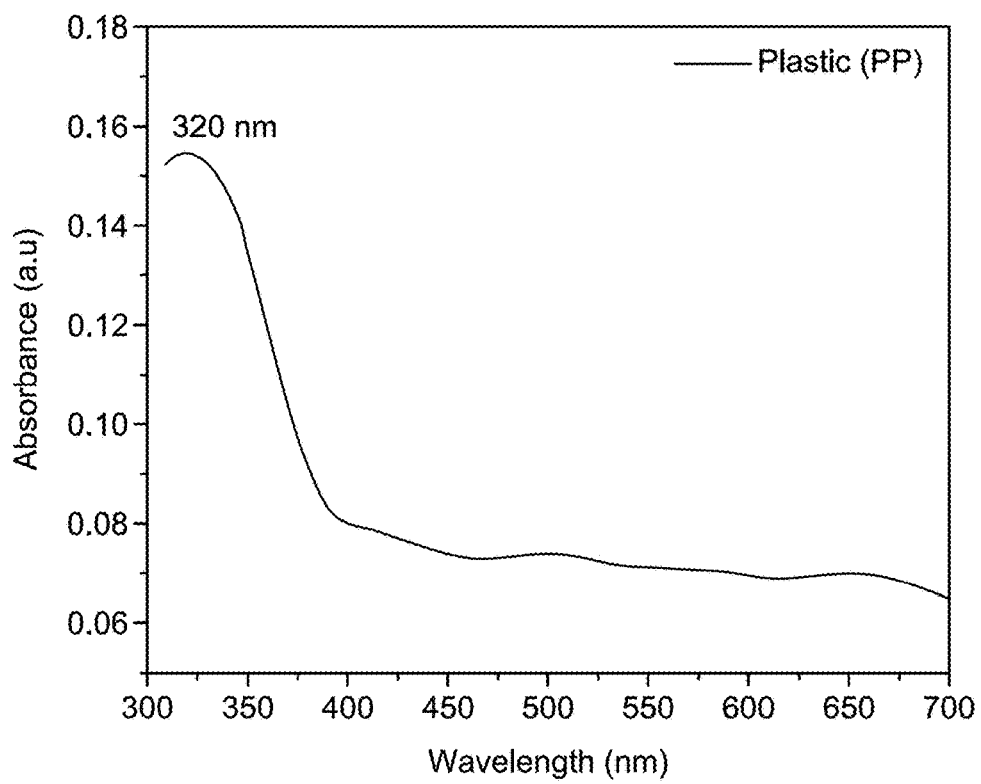
FIG. 3 shows an absorption spectrum of polypropylene (PP) as a solid sample, according to certain embodiments.
Figure 4:
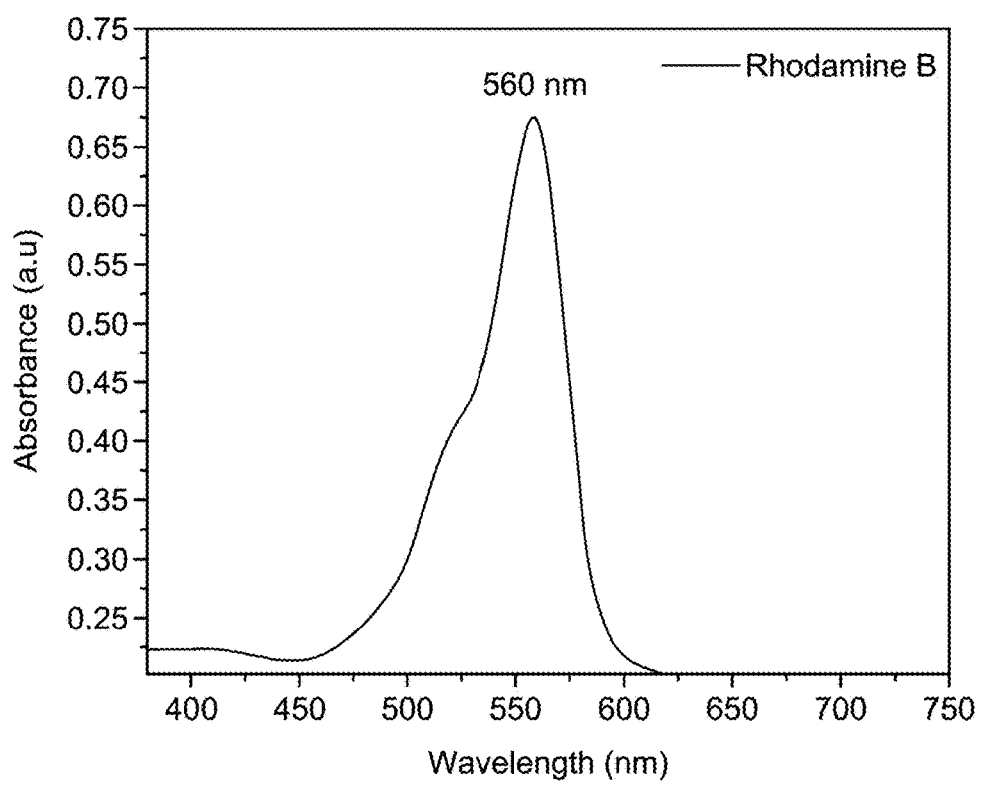
FIG. 4 shows an absorption spectrum of rhodamine B (RhB) in tetrahydrofuran (THF), according to certain embodiments.
Figure 5:
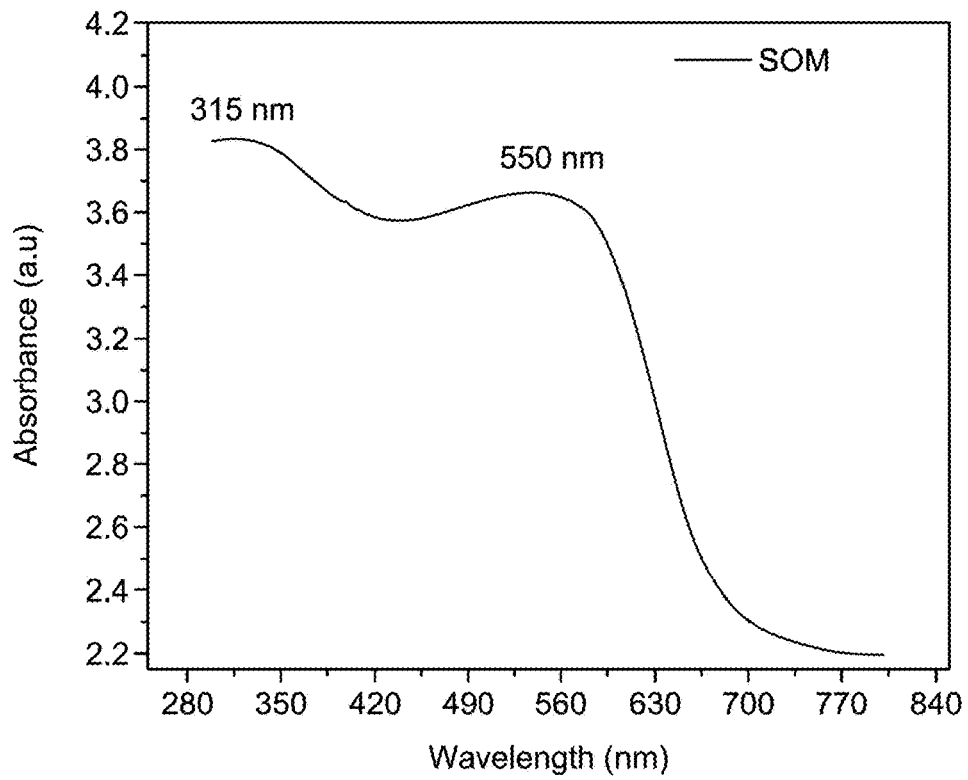
FIG. 5 shows an absorption spectrum of the SOM, according to certain embodiments.

The optical properties of the SOM were characterized by its unique absorption and fluorescence spectra, its optical band gaps, and its laser characteristics. FIG. 3 shows an absorption spectrum of polypropylene (PP) as a solid sample. FIG. 4 shows an absorption spectrum of rhodamine B (RhB) in tetrahydrofuran (THF). FIG. 5 shows an absorption spectrum of the SOM. As may be seen, the absorption spectra of PP as the solid sample and RhB in THF showed bands at 320 nm and 560 nm, respectively. Meanwhile, the absorption spectrum of the SOM drastically changed, with two distinct bands at 315 nm and 550 nm. This indicated interactions formed between the materials incorporated into the SOM.

Figure 6:
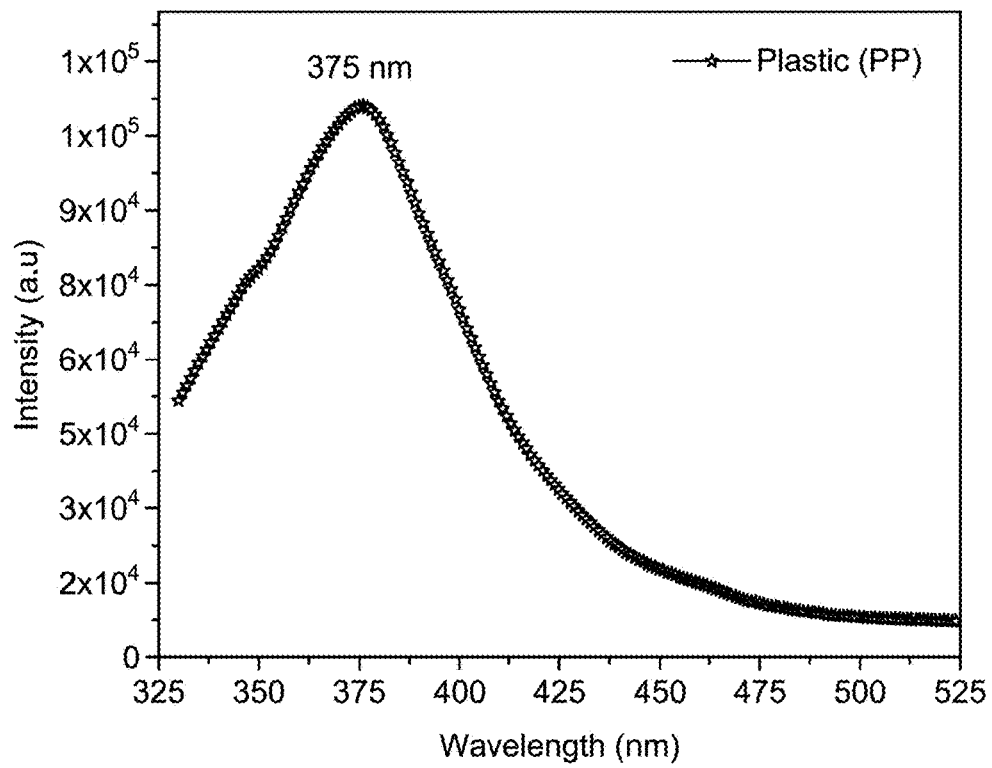
FIG. 6 shows a fluorescence spectrum of PP as a solid sample, according to certain embodiments.
Figure 7:
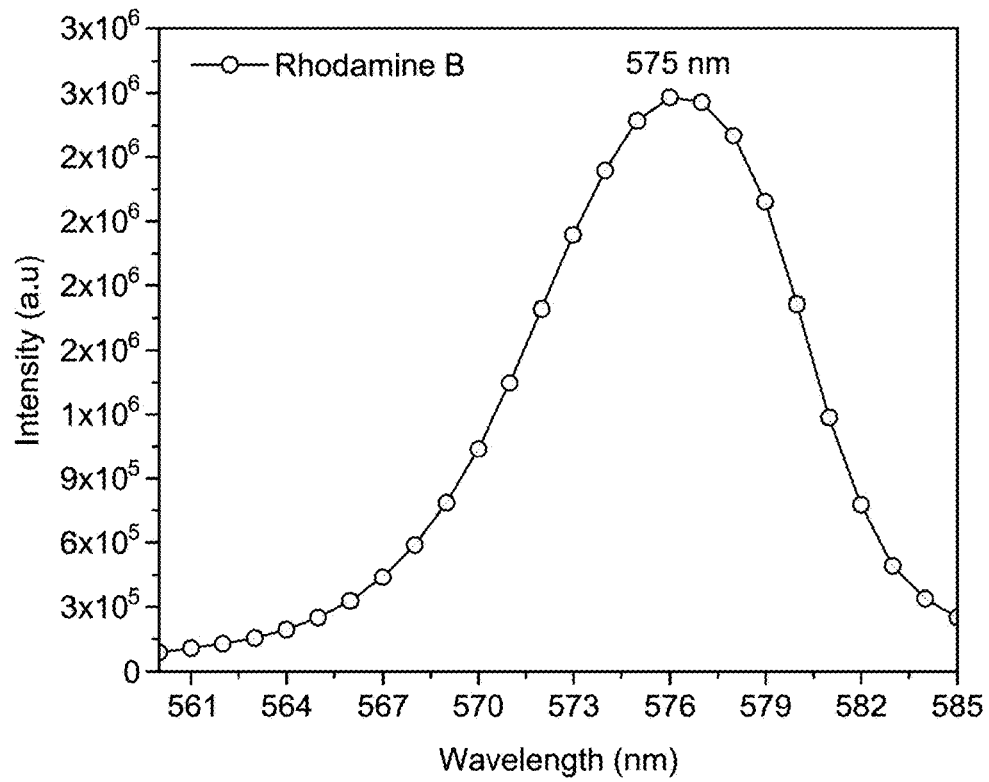
FIG. 7 shows a fluorescence spectrum of RhB in THF, according to certain embodiments.
Figure 8:
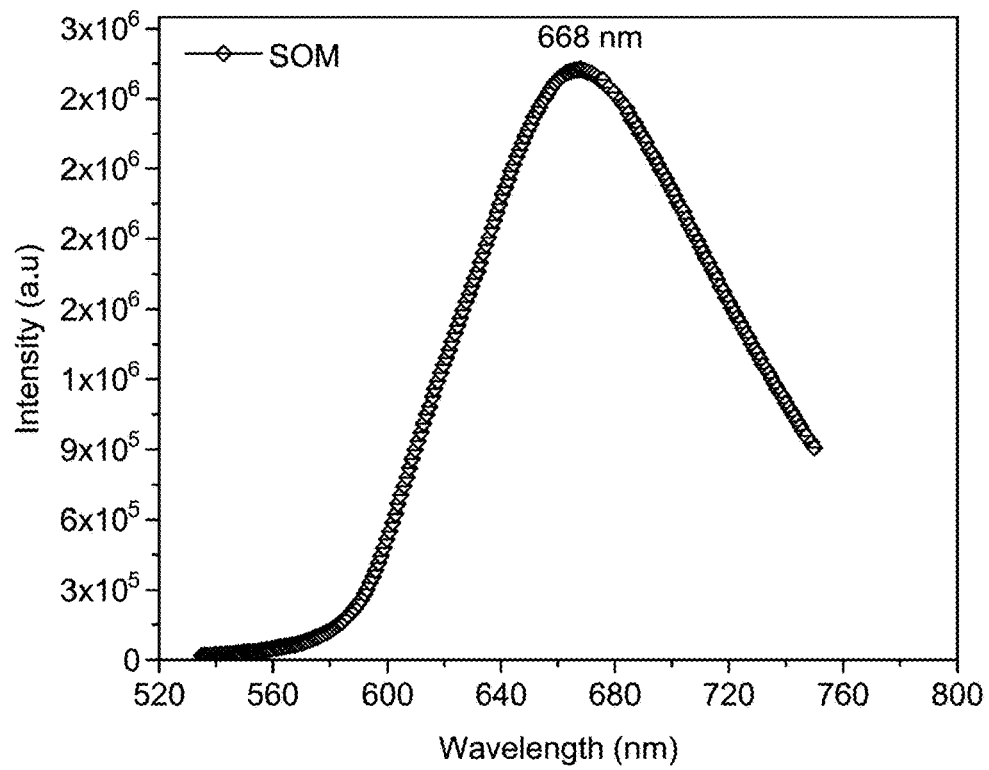
FIG. 8 shows a fluorescence spectrum of the SOM, according to certain embodiments.

Further, FIG. 6 shows a fluorescence spectrum of PP as a solid sample. FIG. 7 shows a fluorescence spectrum of RhB in THF. FIG. 8 shows a fluorescence spectrum of the SOM. As may be seen, the fluorescence spectra of PP in the solid sample and RhB in THF showed bands at 375 nm and 575 nm, respectively. Meanwhile, the fluorescence spectrum of SOM showed a single band at 668 nm. Again, the difference in the fluorescence from the starting materials indicated interactions formed between the materials incorporated into the SOM.

For optical band gaps, the energy band gap of the SOM was computed using the Tauc method with the below equation:

$$\alpha h\nu = B(h\nu - E_g)^n$$

where hv, $\alpha$, $E_g$ and B represent the photon energy, absorption coefficient, bandgap, and band tailing parameter, respectively, whereas n=2 for a direct bandgap.

Figure 9:
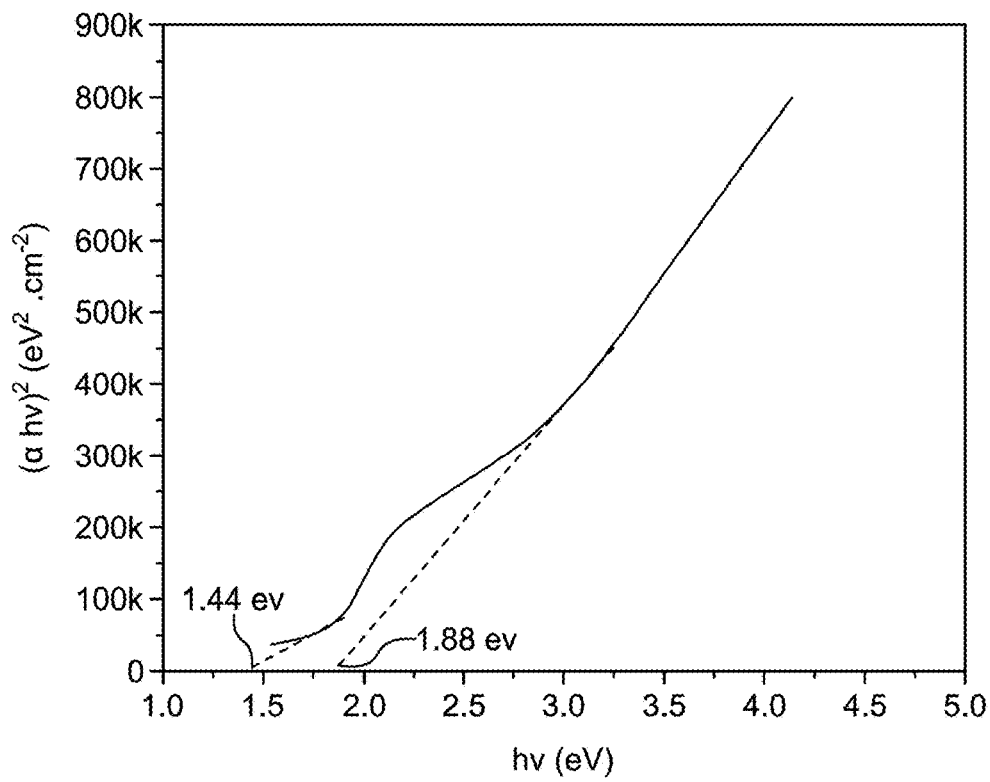
FIG. 9 shows optical band gaps of the SOM, according to certain embodiments.

FIG. 9 shows the optical band gaps of the SOM. To quantify the $E_g$, the straight part of the curve was extrapolated between $(\alpha h\nu)^2$ and hv as shown in FIG. 9. The results revealed that the SOM had two band gaps at 1.44 and 1.88 eV.

Figure 10:
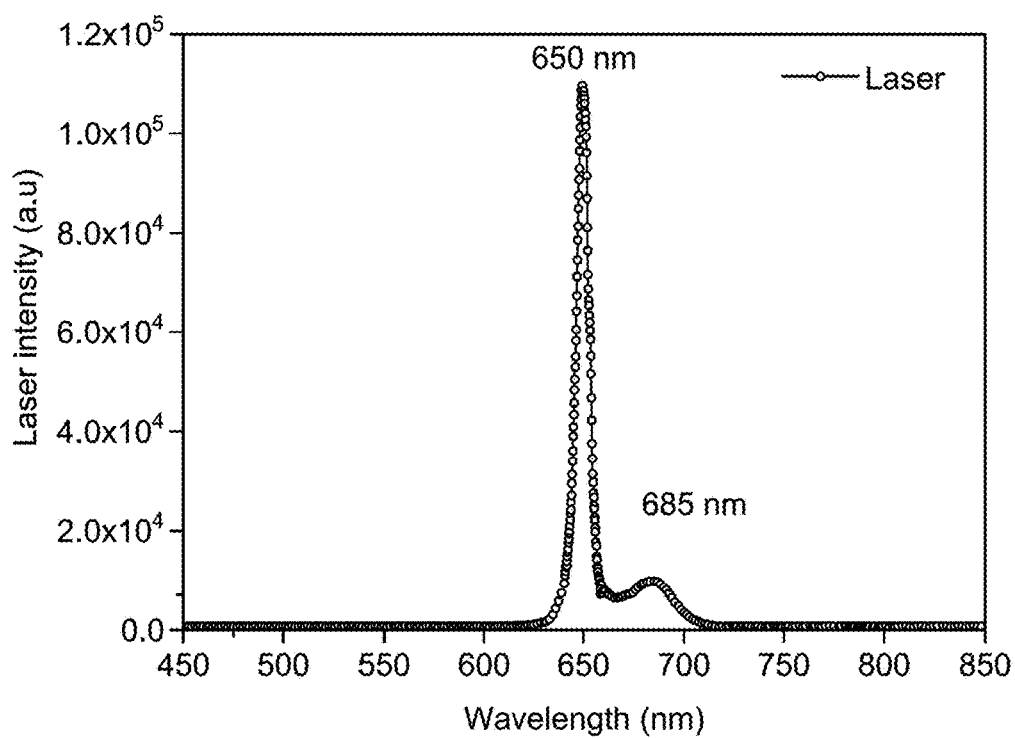
FIG. 10 shows a laser spectrum for the SOM, according to certain embodiments.

For laser characteristics, the SOM was excited under a pulsed laser source of an Nd: YAG laser ($\lambda_{ex}$=355 nm). In particular, a third harmonic (355 nm) of the Nd: YAG laser, with a pulse width of 9 ns, was used as the excitation source. The laser beam (355 nm) was focused by a quartz cylindrical lens (for transverse excitation) of a focal length of 5 cm and was used to excite the SOM. FIG. 10 shows a laser spectrum for the SOM. Under suitable pump power, the SOM produced dual laser peaks at 650 and 685 nm, as shown in FIG. 10. It may be noted that, in contrast, RhB in solid host materials showed laser peaks at 605 to 620 nm.

Figure 11:
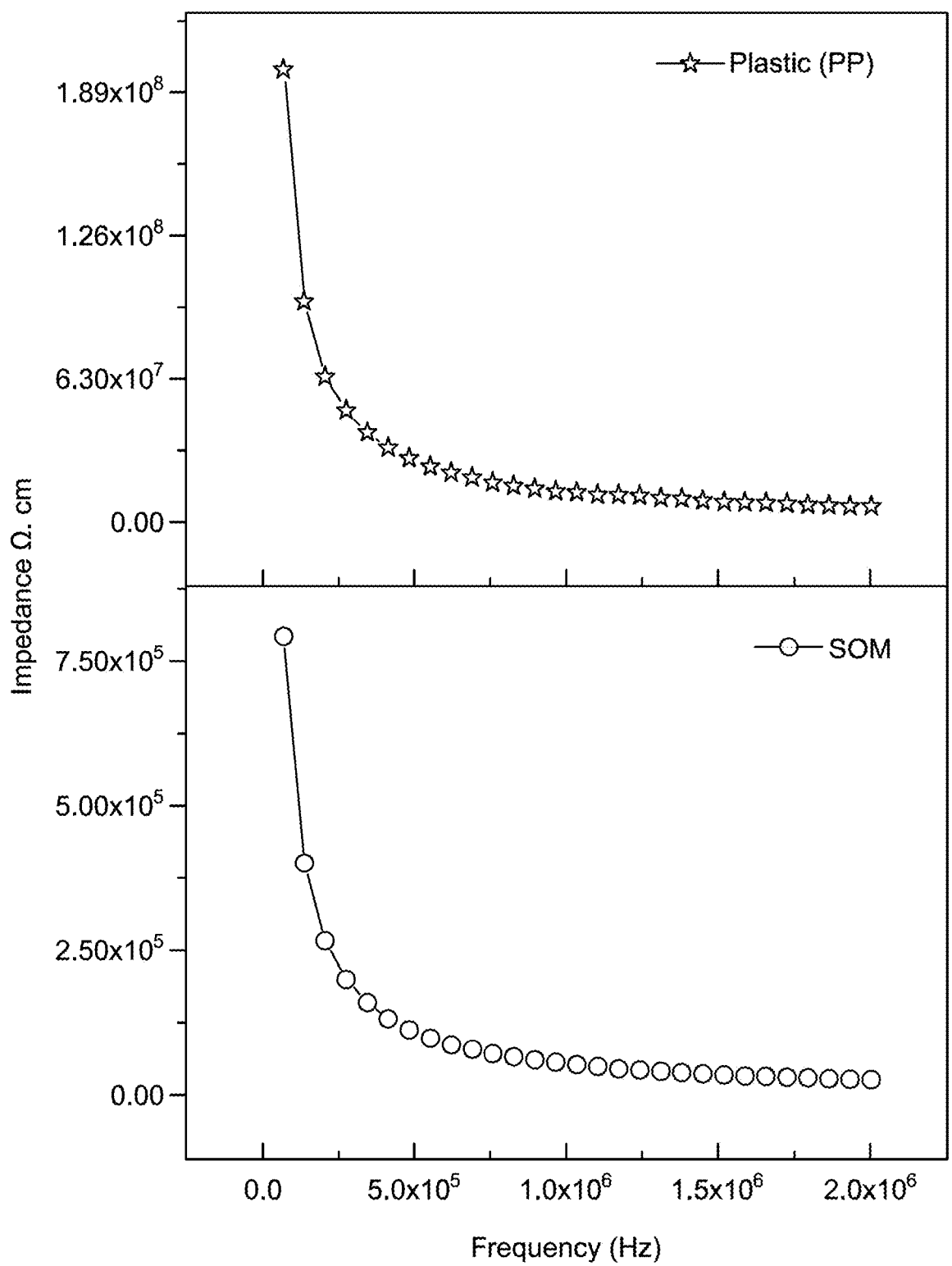
FIG. 11 shows graphical representations of impedance vs frequency for PP and the SOM at room temperature, according to certain embodiments.

The electrical properties of the SOM, particularly its impedance, were measured using an LCR meter (IM 3536). An LCR meter is a type of electronic test equipment used to measure the inductance (L), capacitance (C), and resistance (R) of an electronic component. FIG. 11 shows graphical representations of impedance vs frequency for PP and the SOM at room temperature. The results revealed that the impedance of PP at lower frequencies and room temperature was $1.99 \times 10^8$ Ω.cm. Under the same operational conditions, the impedance of SOM was decreased rapidly to be $7.7 \times 10^5$ Ω.cm as shown in FIG. 11. This is an indication that the SOM became a semiconductor material.

Figure 12:
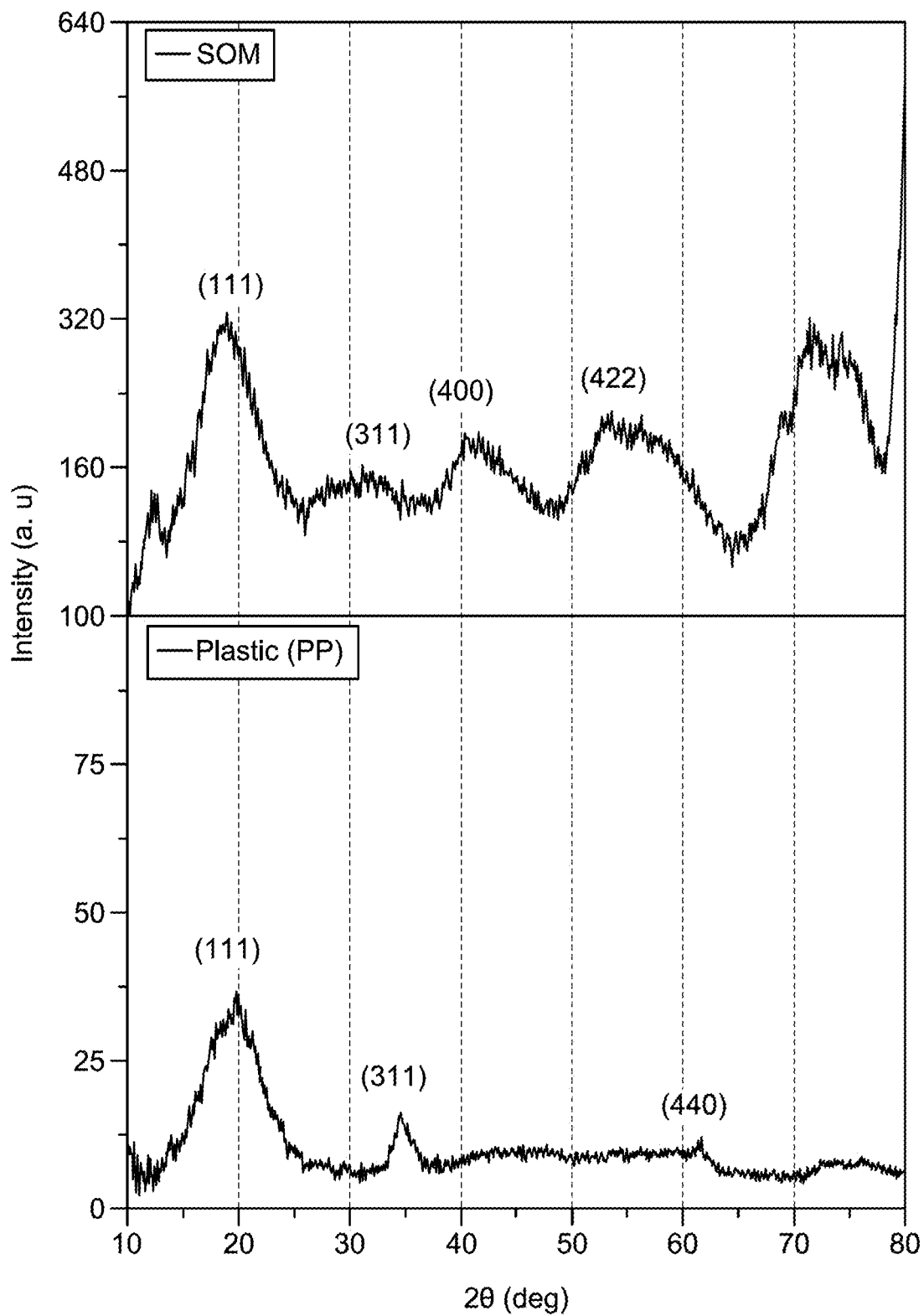
FIG. 12 shows X-ray diffraction (XRD) patterns for PP and SOM, according to certain embodiments.

X-ray diffraction (XRD) analysis was performed to determine the crystalline structure of the SOM. FIG. 12 shows graphical representations of XRD patterns for PP and SOM. In particular, FIG. 12 shows the XRD patterns of PP before and after incorporation into the SOM. The XRD pattern, as depicted, showed prominent peaks at 19.11°, 34.6°, and 62.3°, which correspond to the (hkl) values of (111), (311), and (440), respectively. These peaks indicated the presence of PP. The XRD analysis of SOM revealed peaks at 18.4°, 32.5°, 42.2°, and 54.46°, which match the (hkl) values of (111), (311), (400), and (422). The obtained results indicated the presence of PP in the newly created SOM.

Figure 13A:
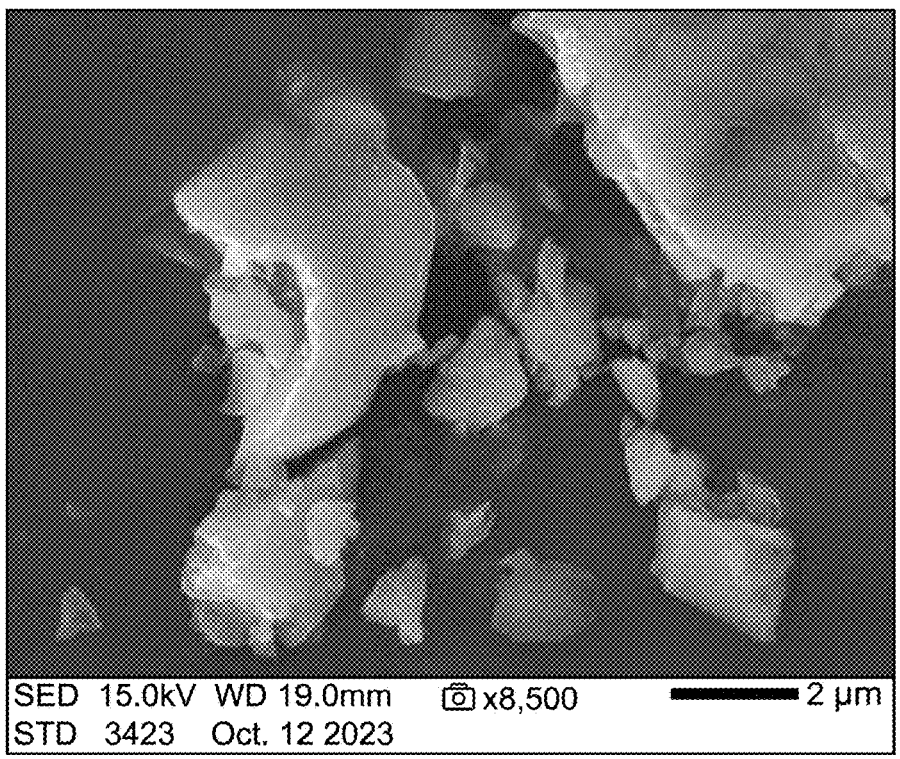
FIG. 13A is an exemplary field emission scanning electron microscopy (FE-SEM) image of the SOM, according to certain embodiments.
Figure 13B:
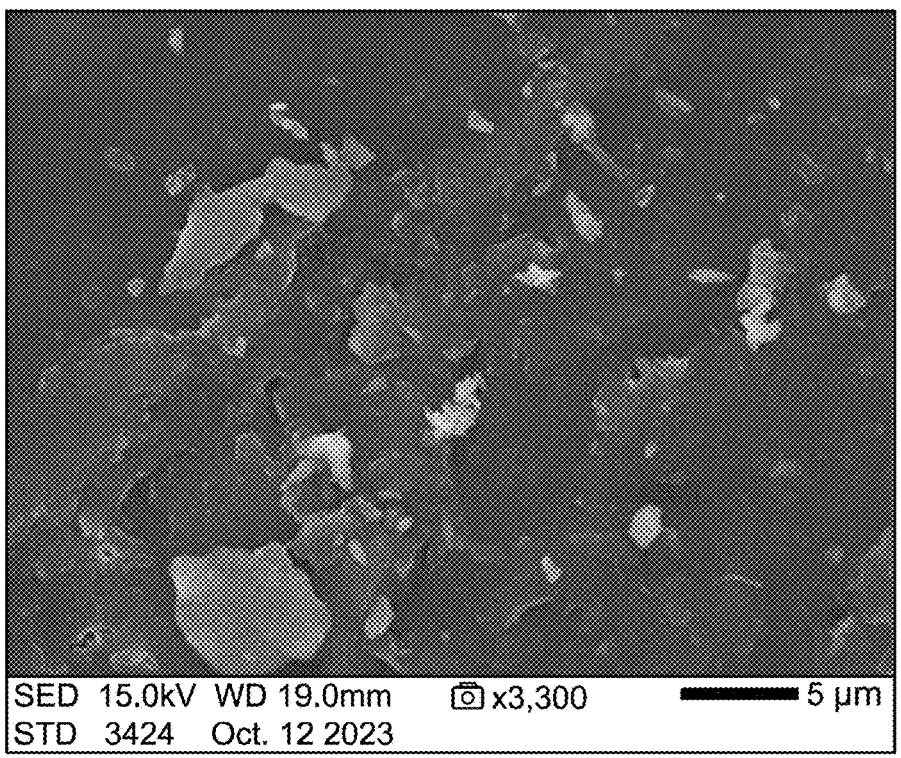
FIG. 13B is another exemplary FE-SEM image of the SOM, according to certain embodiments.
Figure 13C:
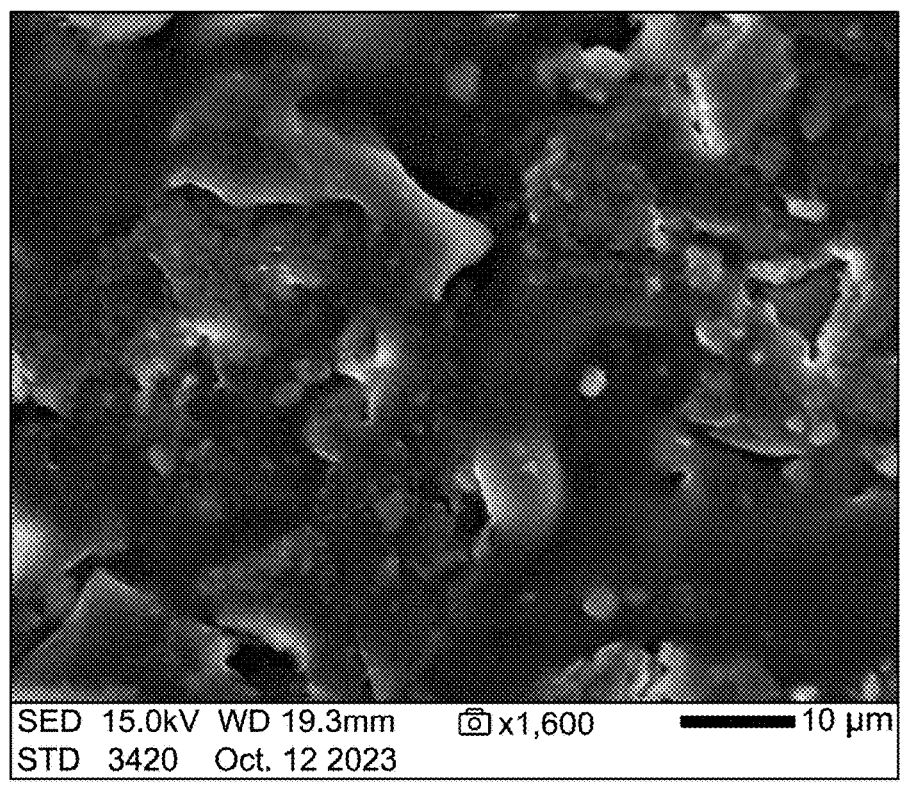
FIG. 13C is another exemplary FE-SEM image of the SOM, according to certain embodiments.

The structural integrity and morphological features of the SOM were important for its application in laser and optoelectronic devices. Using Field Emission Scanning Electron Microscopy (FE-SEM) coupled with Energy Dispersive X-ray Spectrometry (EDX), the morphology of the SOM was examined to ensure consistency and homogeneity in particle distribution. FIG. 13A is an FE-SEM image of the SOM at a magnification of 2 μm. FIG. 13B is an FE-SEM image of the SOM at a magnification of 5 μm. FIG. 13C is an FE-SEM image of the SOM at a magnification of 10 μm. The images show a distribution of particles of the SOM ranging in size from 1-10 μm.

Figure 13D:
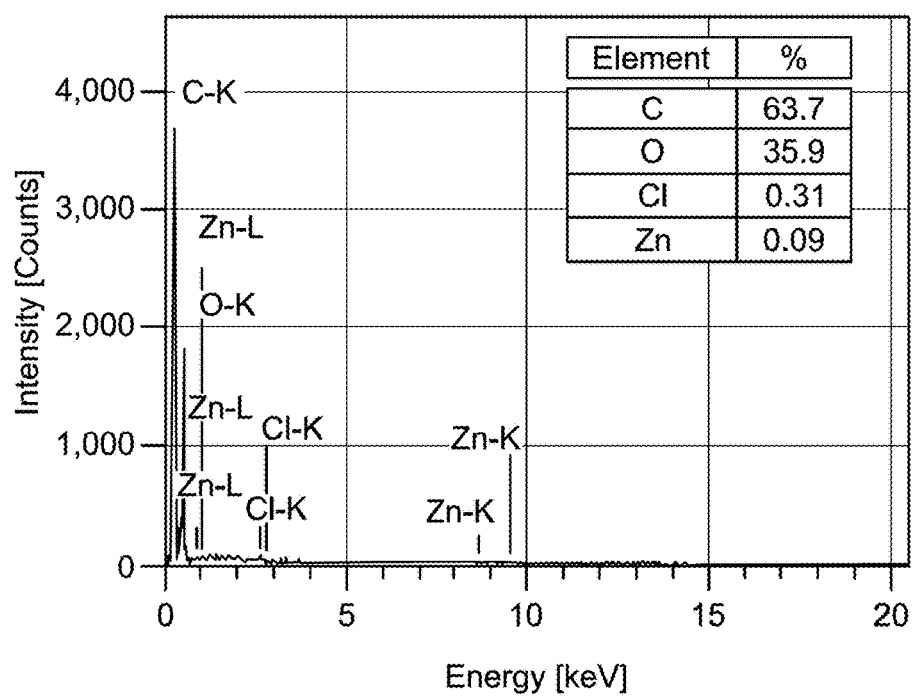
FIG. 13D shows an energy-dispersive X-ray spectrometry (EDX) profile of the SOM, according to certain embodiments.

FIG. 13D shows an EDX profile of the SOM. As shown in FIGS. 13A-13C, the morphology features of SOM were well-defined, with minimal aggregation and high homogeneity. Also, the shape of SOM was characterized by its glass slide-like appearance. Further, the elemental EDX provided the proportion of each element based on elemental ratios. The obtained FE-SEM image displayed distinct peaks corresponding to the elements carbon (C), zinc (Zn), chlorine (Cl), and oxygen (O) in the energy-dispersive X-ray profile.

The present disclosure provides the method for recycling plastic waste by producing a smart optical material from plastic waste, dyes, and metallic zinc for laser and optoelectronic applications. The method of the present disclosure provides an economical fabrication of the SOM from abundant materials under mild conditions. The obtained smart optical material exhibited exceptional optical and electrical properties. The results indicated that the material emits dual-distinct laser peaks at 650 and 685 nm. Additionally, the SOM displayed two optical band gaps: 1.44 and 1.88 eV. The melting point of SOM was determined to be 350° C. Furthermore, the impedance analysis of SOM revealed a decrease in impedance, indicating a transformation from an insulator to a semiconductor (from $10^8$ to $10^5$ Ω.cm). Hence, the acquired material can be used in many diverse photovoltaic and laser applications.

Numerous modifications and variations of the present disclosure are possible in light of the above teachings. It is therefore to be understood that within the scope of the appended claims, the invention may be practiced otherwise than as specifically described herein.

The invention claimed is:

1. A solution polymerization method for a smart optical material (SOM), comprising:
    mixing polypropylene in a solvent to dissolve the polypropylene and form a first solution;
    mixing zinc acetate in 2-hydroxyethyl methacrylate and the solvent then heating to form a second solution;
    mixing rhodamine B and a peroxide into the second solution to form a third solution;
    mixing the third solution into the first solution to form a reaction solution, wherein the peroxide initiates polymerization of the 2-hydroxyethyl methacrylate to form poly (2-hydroxyethyl methacrylate); and
    separating the SOM from the reaction solution by drying, wherein the SOM has at least two bandgaps,
    wherein a first bandgap is from 1.4-1.5 eV, and
    wherein a second bandgap is from 1.8-1.9 eV.

2. The method of claim 1, wherein the SOM comprises 1-10 wt. % of the polypropylene, based on a total weight of the SOM.

3. The method of claim 2, wherein the SOM comprises 0.1-5 wt. % of the rhodamine B, based on a total weight of the SOM.

4. The method of claim 3, wherein the SOM comprises 80-98.9 wt. % of the poly (2-hydroxyethyl methacrylate), based on a total weight of the SOM.

5. The method of claim 1, wherein the rhodamine B is covalently bonded to the poly (2-hydroxyethyl methacrylate).

6. The method of claim 1, wherein the polypropylene is a waste polypropylene.

7. The method of claim 1, wherein the solvent is tetrahydrofuran and the peroxide is benzoyl peroxide.

8. The method of claim 1, wherein the SOM is in a form of particles having an irregular shape and an average size of 0.5-5 μm.

9. The method of claim 8, wherein the particles are not aggregated and wherein the rhodamine B and the polypropylene are homogeneously dispersed in a matrix of the poly (2-hydroxyethyl methacrylate) in the SOM.

10. The method of claim 1, wherein the SOM comprises 60-70 wt. % C, 30-40 wt. % O, 0.1-1 wt. % Cl, and 0.01-0.5 wt. % Zn, based on a total weight of the SOM.

11. The method of claim 1, wherein the SOM has an absorption spectrum and a fluorescence spectrum that differs from an absorption spectrum and a fluorescence spectrum of a solution of rhodamine B alone.

12. The method of claim 1, wherein the SOM has an absorption spectrum with peaks between 310-320 nm and 490-620 nm.

13. The method of claim 1, wherein the SOM has a fluorescence spectrum with a single peak between 640-700 nm.

14. The method of claim 1, wherein upon irradiating the SOM with a 355 nm laser, the SOM produces laser peaks at 650 and 685 nm.

15. The method of claim 1, wherein the SOM has a melting point of 300-350° C.

16. The method of claim 1, wherein the SOM has an impedance of $1 \times 10^5$ to $9 \times 10^5$ Ω·cm.

* * * * *